United States Patent
Wang

(10) Patent No.: US 10,459,009 B2
(45) Date of Patent: Oct. 29, 2019

(54) SELF-ADAPTIVE CURRENT MONITORING CIRCUIT HAVING A VOLTAGE DIVIDING UNIT FOR OUTPUTTING AN INCREASED OR DECREASED DIVIDED VOLTAGE SIGNAL ACCORDING TO A VOLTAGE REGULATION SIGNAL

(71) Applicant: Hangzhou Hongxin Microelectronics Technology Co., Ltd., Hangzhou (CN)

(72) Inventor: Chih-yang Wang, Hangzhou (CN)

(73) Assignee: HANGZHOU HONGXIN MICROELECTRONICS TECHNOLOGY CO., LTD., Hangzhou (CN)

( * ) Notice: Subject to any disclaimer, the term of this patent is extended or adjusted under 35 U.S.C. 154(b) by 154 days.

(21) Appl. No.: 15/871,951

(22) Filed: Jan. 15, 2018

(65) Prior Publication Data
US 2019/0128926 A1    May 2, 2019

(30) Foreign Application Priority Data
Oct. 30, 2017   (CN) .......................... 2017 1 1033687

(51) Int. Cl.
G01R 15/04      (2006.01)
G01R 19/165     (2006.01)
G01J 1/44       (2006.01)

(52) U.S. Cl.
CPC ............... *G01R 15/04* (2013.01); *G01J 1/44* (2013.01); *G01R 19/1659* (2013.01)

(58) Field of Classification Search
CPC ......................................................... G01J 1/44
USPC ..................................................... 250/214 R
See application file for complete search history.

(56) References Cited

U.S. PATENT DOCUMENTS 7,211,780 B2*  5/2007  Nishiyama ........... H04B 10/691
                                                  250/214 R

* cited by examiner

*Primary Examiner* — Que Tan Le
(74) *Attorney, Agent, or Firm* — Muncy, Geissler, Olds & Lowe, P.C.

(57) ABSTRACT

The present invention provides a self-adaptive current monitoring circuit, configured to monitor a current generated by an optical sensing element, including a voltage dividing unit coupled with the optical sensing element for generating a corresponding divided voltage signal according to a current signal of the optical sensing element; a comparison unit coupled with the voltage dividing unit for receiving and generating a monitoring signal according to the divided voltage signal; a threshold unit coupled with the comparison unit for receiving the monitoring signal and comparing the monitoring signal with a threshold signal to output a switch control signal; and a voltage regulation unit coupled with the threshold unit and the voltage dividing unit for receiving and generating a voltage regulation signal according to the switch control signal, and the voltage dividing unit receives and outputs an increased or decreased divided voltage signal according to the voltage regulation signal.

10 Claims, 3 Drawing Sheets

SELF-ADAPTIVE CURRENT MONITORING CIRCUIT HAVING A VOLTAGE DIVIDING UNIT FOR OUTPUTTING AN INCREASED OR DECREASED DIVIDED VOLTAGE SIGNAL ACCORDING TO A VOLTAGE REGULATION SIGNAL

CROSS-REFERENCE TO RELATED APPLICATIONS

This Non-provisional application claims priority under 35 U.S.C. § 119(a) on Patent Application No(s). 201711033687.9 filed in People's Republic of China on Oct. 30, 2017, the entire contents of which are hereby incorporated by reference.

BACKGROUND OF THE INVENTION

Field of the Invention

The present invention relates to an optical communication technical field and, more particularly, to a self-adaptive current monitoring circuit for monitoring a current generated by an optical sensing element.

Description of the Related Art

In today's society, with the development of science and technology, the ways of communication have also made great progress, and optical communication is one of them. For an optical communication module, in the prior art, a corresponding monitoring circuit is provided to monitor the working status of the optical communication module. As shown in FIG. 1, an optical sensing component is provided at the input end of a trans-impedance amplifier. The monitoring method for the optical sensing component is acquiring a divided voltage signal of a voltage division circuit connected in series with the optical sensing component, i.e., the voltages at two points Va and Vb in the figure. Then, a turn-on voltage signal of a PMOS transistor representing a monitoring current $I_{mon}$ is outputted after comparison. However, this method has the problem of poor monitoring accuracy. The main problem lies in the resistance value of the voltage division circuit. If the resistance value is relatively small, the monitoring current $I_{mon}$ will be too large or too small and cannot truly reflect the working status of the optical sensing component. If the resistance value is relatively large, the voltage at Va will be lower than the working voltage of the trans-impedance amplifier, as a result of which the trans-impedance amplifier cannot work properly.

BRIEF SUMMARY OF THE INVENTION

The present invention provides a self-adaptive current monitoring circuit to solve the above-mentioned problems.

To solve the above problems, one embodiment of the present invention provides a self-adaptive current monitoring circuit, configured to monitor a current generated by an optical sensing element, including a voltage dividing unit, a comparison unit, a threshold unit, and a voltage regulation unit;

the voltage dividing unit coupled with the optical sensing element, and the voltage dividing unit configured to generate a corresponding divided voltage signal according to a current signal of the optical sensing element;

the comparison unit coupled with the voltage dividing unit, and the comparison unit configured to receive and generate a monitoring signal according to the divided voltage signal;

the threshold unit coupled with the comparison unit, and the threshold unit configured to receive the monitoring signal and compare the monitoring signal with a threshold signal to output a switch control signal; and the voltage regulation unit coupled with the threshold unit and the voltage dividing unit, the voltage regulation unit configured to receive and generate a voltage regulation signal according to the switch control signal, and the voltage dividing unit receiving and outputting an increased or decreased divided voltage signal according to the voltage regulation signal.

As an implementation mode, the self-adaptive current monitoring circuit may further include a current mirror unit coupled with the comparison unit and the threshold unit. The current mirror unit may be configured to receive and mirror the monitoring signal and output the switch control signal according to a mirrored monitoring signal and the threshold signal.

As an implementation mode, the current mirror unit may include at least two stages of mirror circuits. A first-stage mirror circuit may be coupled with the comparison unit for mirroring the monitoring signal of the comparison unit. Each of the other mirror circuits except the first-stage mirror circuit may be coupled with a previous-stage mirror circuit thereof for mirroring a current signal of the previous-stage mirror circuit.

As an implementation mode, the number of the voltage regulation unit and the number of the mirror circuits may be set correspondingly.

As an implementation mode, the current mirror unit may include the first-stage mirror circuit and a second-stage mirror circuit, and the threshold unit may include a first threshold circuit and a second threshold circuit;

the first-stage mirror circuit may be coupled with the comparison unit and the first threshold circuit, and the first-stage mirror circuit may be configured to receive and mirror the monitoring signal and output a first switch control signal according to a mirrored monitoring signal and a first threshold signal; and the second-stage mirror circuit may be coupled with the first-stage mirror circuit and the second threshold circuit, and the second-stage mirror circuit may be configured to receive a first mirror current signal generated by the first-stage mirror circuit after the first-stage mirror circuit mirrors the monitoring signal and may be configured to output a second switch control signal according to the first mirror current signal and a second threshold signal.

As an embodiment, the voltage regulation unit may include a first voltage regulation circuit and a second voltage regulation circuit;

the first voltage regulation circuit may be coupled with the first stage mirror circuit and the voltage dividing unit, and the first voltage regulation circuit may be configured to receive and control the first voltage regulation circuit to be integrated into the voltage division unit according to the first switch control signal and configured to carry on a first voltage regulation to the divided voltage signal generated by the voltage dividing unit; and the second voltage regulation circuit may be coupled with the second stage mirror current and the voltage dividing unit, and the second voltage regulation circuit may be configured to receive and control the second voltage regulation circuit to be integrated into the voltage division unit according to the second switch control signal and configured to carry on a second voltage regulation to the divided voltage signal generated by the voltage dividing unit.

As an embodiment, the first voltage regulation circuit and the second voltage regulation circuit may be both connected in parallel with the voltage dividing unit.

Compared with the prior art, the present invention has the following beneficial effects: by real-time monitoring the monitoring signal representing the current value of the optical sensing element and adjusting the divided voltage signal of the voltage dividing unit according to the monitoring signal through the voltage regulation unit, the monitoring accuracy of the self-adaptive current monitoring circuit can be increased; and through the current mirror unit, the current representing the optical sensing element can be real-time monitored, providing information to determine the current value at present.

Figure reference numbers: 1 voltage dividing unit; 2 comparison unit; 3 threshold unit; 31 first threshold circuit; 32 second threshold circuit; 4 voltage regulation unit; 41 first voltage regulation circuit; 42 second voltage regulation circuit; 5 current mirror unit; 51 first-stage mirror circuit; 52 second-stage mirror circuit.

DETAILED DESCRIPTION OF THE INVENTION

The above and other technical features and advantages of the present invention will be clearly and completely described combining with the accompanying drawings hereinafter. Apparently, the described embodiments are merely parts of the embodiments of the present invention instead of all the embodiments.

Figure 1:
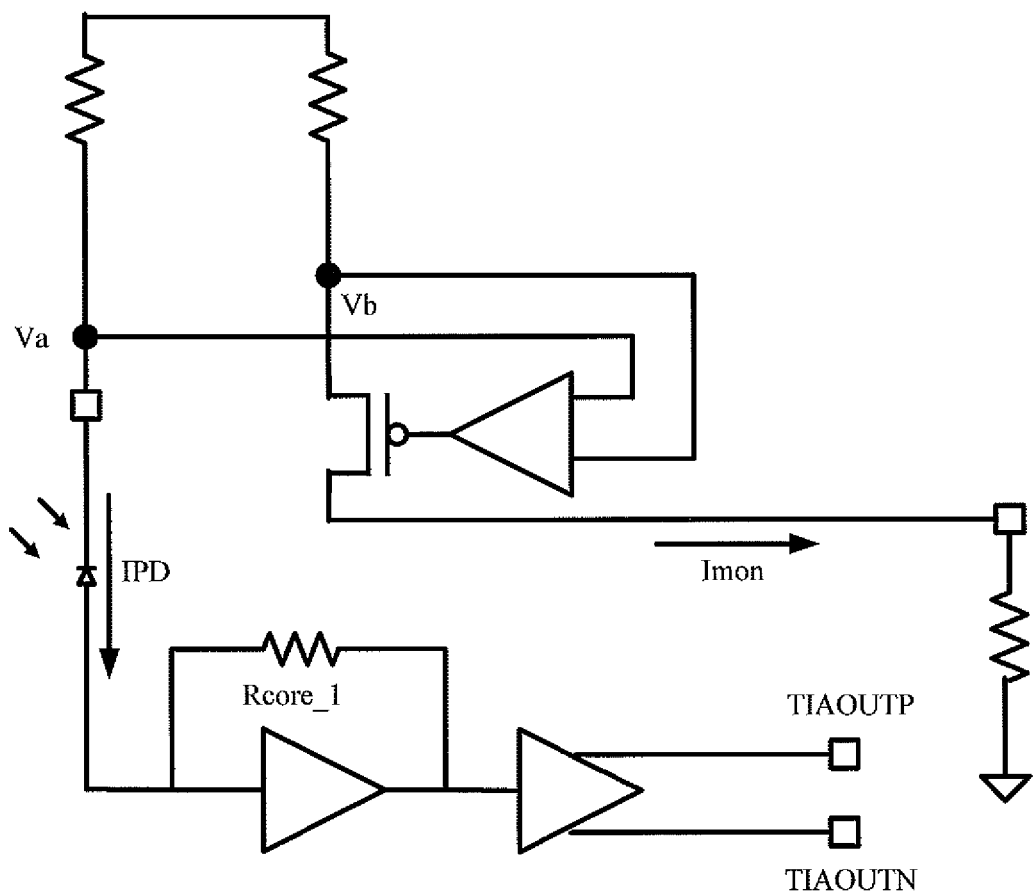
FIG. 1 is a circuit diagram of a current monitoring circuit in the prior art.
Figure 2:
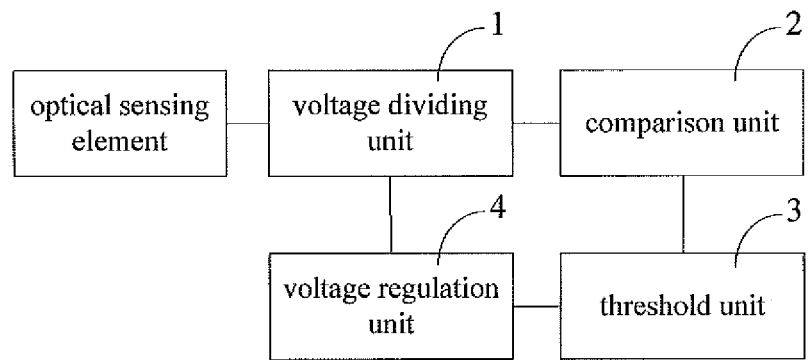
FIG. 2 is a structure connection block diagram of a self-adaptive current monitoring circuit of the present invention.

As shown in FIG. 2, a self-adaptive current monitoring circuit includes a voltage dividing unit 1, a comparison unit 2, a threshold unit 3, and a voltage regulation unit 4; the voltage dividing unit 1 is configured to generate a corresponding divided voltage signal according to a current signal of an optical sensing element in a trans-impedance amplifier; the comparison unit 2 is coupled with the voltage dividing unit 1 for receiving and generating a monitoring signal according to the divided voltage signal; the threshold unit 3 is coupled with the comparison unit 2 for receiving the monitoring signal and comparing the monitoring signal with a threshold signal to output a switch control signal; and the voltage regulation unit 4 is coupled with the threshold unit 3 and the voltage dividing unit 1 for receiving and generating a voltage regulation signal according to the switch control signal, and the voltage dividing unit receives and outputs an increased or decreased divided voltage signal according to the voltage regulation signal.

Embodiment 1

Figure 3:
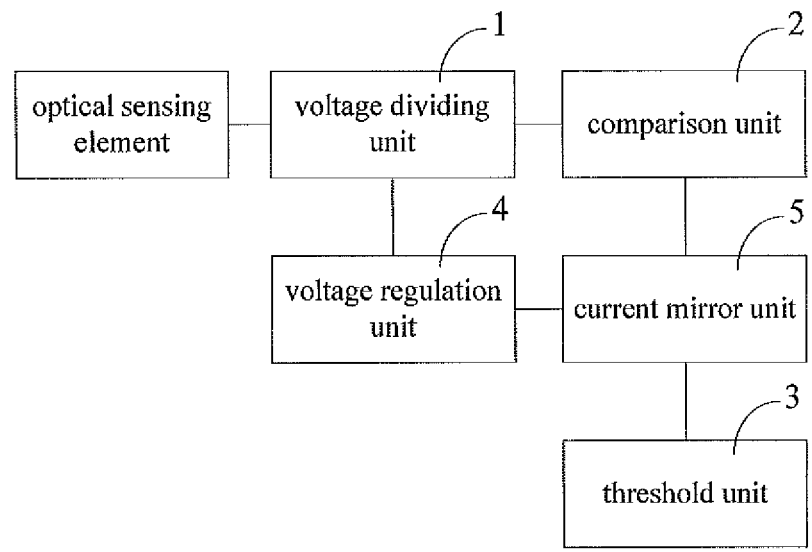
FIG. 3 is a structure connection block diagram of a self-adaptive current monitoring circuit in another embodiment of the present invention.

As shown in FIG. 3, in order to increase the dynamic input range of the circuit, in this embodiment, a current mirror unit 5 is added to provide information to determine the current value at present. The current mirror unit 5 is coupled with the comparison unit 2 and the threshold unit 3 for receiving and mirroring the monitoring signal of the comparison unit 2 and outputting the switch control signal according to a mirrored monitoring signal and the threshold signal.

In one embodiment, the current mirror unit 5 includes at least two stages of mirror circuits. A first-stage mirror circuit 51 is coupled with the comparison unit 2 for mirroring the monitoring signal of the comparison unit 2. Each of the other mirror circuits except the first-stage mirror circuit 51 is coupled with a previous-stage mirror circuit thereof for mirroring the current signal of the previous-stage mirror circuit. The number of the voltage regulation unit 4 and the number of the mirror circuits are set correspondingly.

Embodiment 2

Figure 4:
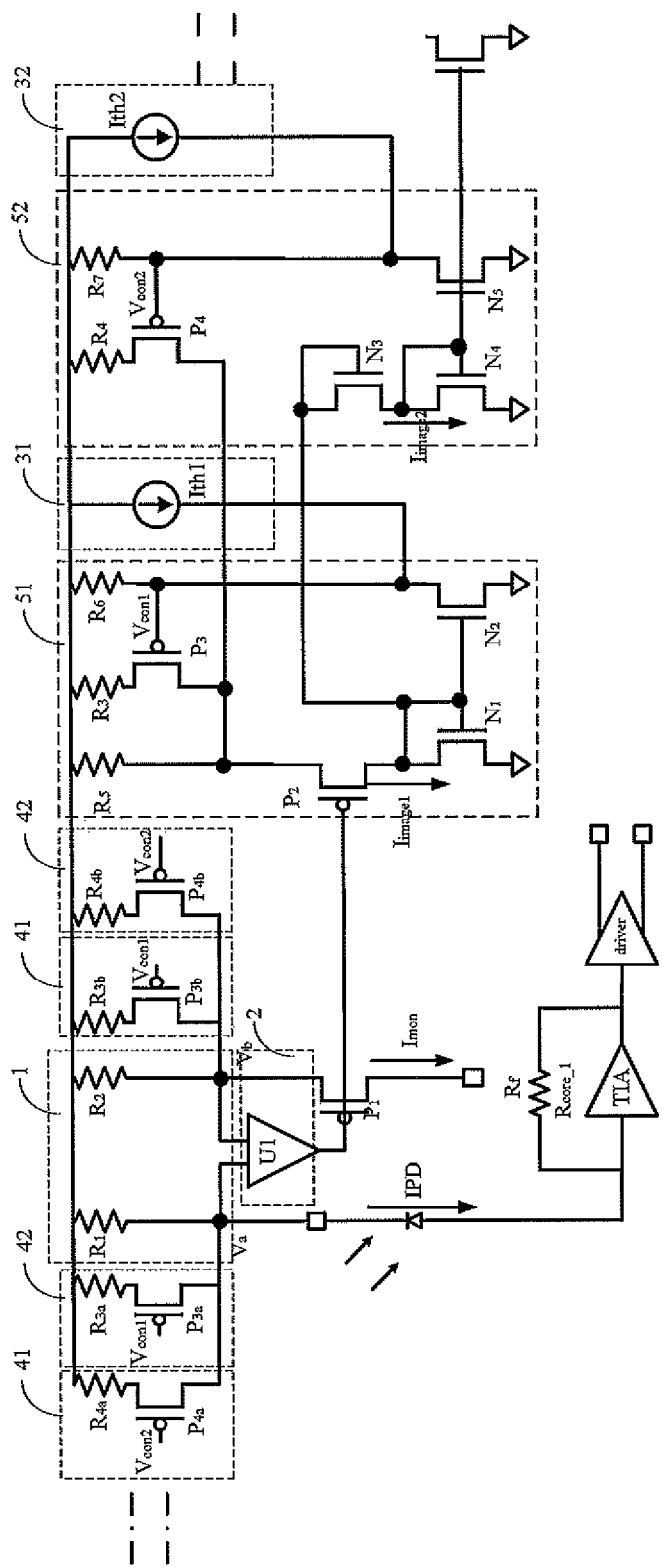
FIG. 4 is a circuit diagram of the self-adaptive current monitoring circuit of the present invention.

As shown in FIG. 4, the voltage dividing unit 1 includes a resistor R1 and a resistor R2 connected in series. One end of the resistor R1 is coupled with the optical sensing element of the trans-impedance amplifier. The connection node of the optical sensing element and the resistor R1 generates a first divided voltage signal Va, and the connection node of the resistor R1 and the resistor R2 generates a second divided voltage signal Vb. The first divided voltage signal Va and the second divided voltage signal Vb generated by the voltage dividing unit 1 are inputted to two input ends of the comparator U1 of the comparison unit 2, respectively, and the output end of the comparator U1 outputs the monitoring signal.

As shown in FIG. 4, in the present embodiment, the current mirror unit 5 includes a first-stage mirror circuit 51 and a second-stage mirror circuit 52, and the threshold unit 3 includes a first threshold circuit 31 and a second threshold circuit 32. In the present embodiment, the first threshold circuit 31 and the second threshold circuit 32 are both current sources; the first-stage mirror circuit 51 is coupled with the output end of the comparator U1 and the first threshold circuit 31 for receiving and mirroring the monitoring signal and outputting a first switch control signal $V_{con1}$ according to a mirrored monitoring signal (that is the first mirror current signal $I_{image1}$) and a first threshold signal $I_{th1}$; and the second-stage mirror circuit 52 is coupled with the first-stage mirror circuit 51 and the second threshold circuit 32 for receiving a first mirror current signal generated by the first-stage mirror circuit 51 after the first-stage mirror circuit 51 mirrors the monitoring signal and for outputting a second switch control signal $V_{con2}$ according to the first mirror current signal (actually, a second mirror current signal $I_{image2}$ is generated according to the first mirror current signal) and a second threshold signal $I_{th2}$. The number of the mirror circuits and the threshold circuits can be set to more than one. The larger the number is, the higher the accuracy will be.

For the embodiment having the two stages of mirror circuits, correspondingly, the voltage regulation unit 4 includes a first voltage regulation circuit 41 and a second voltage regulation circuit 42. The first voltage regulation circuit 41 is coupled with the first-stage mirror circuit 51 and the voltage dividing unit 1 for receiving and controlling the first voltage regulation circuit 41 to be integrated into the voltage division unit 1 according to the first switch control signal and for carrying on a first voltage regulation to the divided voltage signal generated by the voltage dividing unit 1; and the second voltage regulation circuit 42 is coupled with the second-stage mirror current 52 and the voltage dividing unit 1 for receiving and controlling the second voltage regulation circuit 42 to be integrated into the voltage division unit 1 according to the second switch control signal and for carrying on a second voltage regulation to the divided voltage signal generated by the voltage dividing unit 1. During the voltage regulation, for the resistor R1 and resistor R2 of the voltage division circuit, the same voltage regulation circuit on both sides of the voltage division circuit works at the same time, the first voltage regulation is that a PMOS transistor P3a and a PMOS transistor P3b are turned on at the same time under the control of the first switch control signal $V_{con1}$; and the second voltage regulation is that a PMOS transistor P4a and a PMOS transistor P4b are turned on at the same time under the control of the second switch control signal $V_{con2}$. In the present embodiment, the first voltage regulation circuit 41 and the second voltage regulation circuit 42 are both connected in parallel with the voltage dividing unit 1, that is to reduce the effective resistance in the voltage dividing unit 1 by increasing the parallel resistance, thereby reducing the first divided voltage signal Va and the second divided voltage signal Vb.

In the present embodiment, the second mirror current signal $I_{image2}$ is greater than the first mirror current signal $I_{image1}$, the second threshold signal $I_{th2}$ is greater than the first threshold signal $I_{th1}$, and the resistance values of the resistor R4a and the resistor R4b are smaller than the resistance values of the resistor R3a and the resistor R3b. The objective is to adjust the accuracy to be higher and higher. Similarly, in order to achieve higher accuracy, when the mirror circuits with three stages or more than three stages are set, the value of the mirror current signal, the threshold signal and the adjusting resistor are all smaller than those of the previous stage.

By real-time monitoring the monitoring signal representing the current value of the optical sensing element and adjusting the divided voltage signal of the voltage dividing unit 1 according to the monitoring signal through the voltage regulation unit 4, the present invention increases the monitoring accuracy of the self-adaptive current monitoring circuit; and through the current mirror unit 5, the divided voltage signal can be prevented from signal oscillation during the turn-on and turn-off of the voltage regulation unit 4, which makes the monitoring signal more stable.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A self-adaptive current monitoring circuit, configured to monitor a current generated by an optical sensing element, the self-adaptive current monitoring circuit comprising a voltage dividing unit, a comparison unit, a threshold unit, and a voltage regulation unit;

the voltage dividing unit coupled with the optical sensing element, and the voltage dividing unit configured to generate a corresponding divided voltage signal according to a current signal of the optical sensing element;

the comparison unit coupled with the voltage dividing unit, and the comparison unit configured to receive and generate a monitoring signal according to the divided voltage signal;

the threshold unit coupled with the comparison unit, and the threshold unit configured to receive the monitoring signal and compare the monitoring signal with a threshold signal to output a switch control signal; and the voltage regulation unit coupled with the threshold unit and the voltage dividing unit, the voltage regulation unit configured to receive and generate a voltage regulation signal according to the switch control signal, and the voltage dividing unit receiving and outputting an increased or decreased divided voltage signal according to the voltage regulation signal.

2. The self-adaptive current monitoring circuit according to claim 1, further comprising a current mirror unit coupled with the comparison unit and the threshold unit, and the current mirror unit configured to receive and mirror the monitoring signal and output the switch control signal according to a mirrored monitoring signal and the threshold signal.

3. The self-adaptive current monitoring circuit according to claim 2, the current mirror unit comprising at least two stages of mirror circuits, wherein a first-stage mirror circuit is coupled with the comparison unit for mirroring the monitoring signal of the comparison unit, and each of other mirror circuits except the first-stage mirror circuit is coupled with a previous-stage mirror circuit thereof for mirroring a current signal of the previous-stage minor circuit.

4. The self-adaptive current monitoring circuit according to claim 3, wherein the number of the voltage regulation unit and the number of the mirror circuits are set correspondingly.

5. The self-adaptive current monitoring circuit according to claim 1, wherein the current mirror unit comprises a first-stage mirror circuit and a second-stage mirror circuit, and the threshold unit comprises a first threshold circuit and a second threshold circuit;

wherein the first-stage minor circuit is coupled with the comparison unit and the first threshold circuit, and the first-stage mirror circuit is configured to receive and mirror the monitoring signal and output a first switch control signal according to a mirrored monitoring signal and a first threshold signal; and wherein the second-stage mirror circuit is coupled with the first-stage mirror circuit and the second threshold circuit, the second-stage mirror circuit is configured to receive a first mirror current signal generated by the first-stage mirror circuit after the first-stage minor circuit minors the monitoring signal and is configured to output a second switch control signal according to the first mirror current signal and a second threshold signal.

6. The self-adaptive current monitoring circuit according to claim 3, wherein the current minor unit comprises the first-stage mirror circuit and a second-stage mirror circuit, and the threshold unit comprises a first threshold circuit and a second threshold circuit;

wherein the first-stage minor circuit is coupled with the comparison unit and the first threshold circuit, and the first-stage mirror circuit is configured to receive and mirror the monitoring signal and output a first switch control signal according to a mirrored monitoring signal and a first threshold signal; and wherein the second-stage mirror circuit is coupled with the first-stage mirror circuit and the second threshold circuit, the second-stage mirror circuit is configured to receive a first mirror current signal generated by the first-stage mirror circuit after the first-stage minor circuit minors the monitoring signal and is configured to output a second switch control signal according to the first mirror current signal and a second threshold signal.

7. The self-adaptive current monitoring circuit according to claim 5, the voltage regulation unit comprising a first voltage regulation circuit and a second voltage regulation circuit;

the first voltage regulation circuit coupled with the first-stage mirror circuit and the voltage dividing unit, and the first voltage regulation circuit configured to receive and control the first voltage regulation circuit to be integrated into the voltage division unit according to the first switch control signal and configured to carry on a first voltage regulation to the divided voltage signal generated by the voltage dividing unit; and the second voltage regulation circuit coupled with the second stage mirror circuit and the voltage dividing unit, and the second voltage regulation circuit configured to receive and control the second voltage regulation circuit to be integrated into the voltage division unit according to the second switch control signal and configured to carry on a second voltage regulation to the divided voltage signal generated by the voltage dividing unit.

8. The self-adaptive current monitoring circuit according to claim 6, the voltage regulation unit comprising a first voltage regulation circuit and a second voltage regulation circuit;

the first voltage regulation circuit coupled with the first-stage mirror circuit and the voltage dividing unit, and the first voltage regulation circuit configured to receive and control the first voltage regulation circuit to be integrated into the voltage division unit according to the first switch control signal and configured to carry on a first voltage regulation to the divided voltage signal generated by the voltage dividing unit; and the second voltage regulation circuit coupled with the second stage mirror circuit and the voltage dividing unit, and the second voltage regulation circuit configured to receive and control the second voltage regulation circuit to be integrated into the voltage division unit according to the second switch control signal and configured to carry on a second voltage regulation to the divided voltage signal generated by the voltage dividing unit.

9. The self-adaptive current monitoring circuit according to claim 7, wherein the first voltage regulation circuit and the second voltage regulation circuit are both connected in parallel with the voltage dividing unit.

10. The self-adaptive current monitoring circuit according to claim 8, wherein the first voltage regulation circuit and the second voltage regulation circuit are both connected in parallel with the voltage dividing unit.

* * * * *